(12) United States Patent
Gulati et al.

(10) Patent No.: US 9,064,556 B2
(45) Date of Patent: Jun. 23, 2015

(54) HIGH FREQUENCY PSEUDO DUAL PORT MEMORY

(71) Applicant: QUALCOMM Incorporated, San Diego, CA (US)

(72) Inventors: Chirag Gulati, Rajasthan (IN); Lakshmikantha Holla Vakwadi, Bangalore (IN); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/061,528

(22) Filed: Oct. 23, 2013

(65) Prior Publication Data

US 2015/0109865 A1    Apr. 23, 2015

(51) Int. Cl.
*G11C 7/10* (2006.01)
*G11C 7/12* (2006.01)

(52) U.S. Cl.
CPC ........................................ *G11C 7/12* (2013.01)

(58) Field of Classification Search
CPC ..................... G11C 11/412; G11C 2207/2227; G11C 11/419; G11C 11/4023; G11C 16/24; G11C 16/28; G11C 17/12; G11C 7/12
USPC ........ 365/190, 202, 233.11, 189.02, 189.011, 365/189.16, 226, 233.12
See application file for complete search history.

(56) References Cited

U.S. PATENT DOCUMENTS

| 5,506,805 | A  | * | 4/1996 | Hirose et al. .................. 365/194 |
| 6,882,562 | B2 |   | 4/2005 | Beucler |
| 7,224,635 | B2 |   | 5/2007 | Lambrache et al. |
| 7,254,088 | B2 |   | 8/2007 | Kurumada et al. |
| 7,742,350 | B2 |   | 6/2010 | Yamaguchi et al. |
| 7,869,293 | B2 |   | 1/2011 | Morein |

* cited by examiner

*Primary Examiner* — Thong Q Le
(74) *Attorney, Agent, or Firm* — Haynes and Boone, LLP

(57) ABSTRACT

A pseudo dual port (PDP) memory is disclosed having a write driver that selectively precharges only one of a bit line and a complement bit line in a bit line pair responsive to a bit value to be written into an accessed bitcell while discharging a remaining one of the bit line and the complement bit line. In this fashion, the cleanup time between a read operation and a write operation during a read/write clock cycle is advantageously reduced.

19 Claims, 4 Drawing Sheets

HIGH FREQUENCY PSEUDO DUAL PORT MEMORY

TECHNICAL FIELD

This application relates to a pseudo dual port memory, and more particularly, to a high speed pseudo dual port memory with selectively precharged bit lines.

BACKGROUND

Dual port memories have independent read and write ports. For example, video dual port memories may be used to write a new frame of video data through a write port while an existing frame of video data is read through a read port. The separate read and write ports require 8-transistor (8T) bitcells. While the simultaneous read and write operations increase operating speed, the 8T bitcell structure demands die area. To increase density, pseudo dual port (PDP) memories have been developed. A PDP memory mimics the read and write ports of a dual port memory through a time multiplexing of the read and write operations within each memory clock cycle. The time multiplexing of the read/write accesses allows PDP memories to be implemented using fewer transistors, e.g., 6-transistor (6T) bitcells.

In a memory clock cycle for a PDP memory, a read operation is followed by a write operation. During the read operation, the appropriate word line is asserted to a power supply voltage VDD to retrieve the bit stored in an accessed bitcell. The asserted word line voltage switches on the access transistors to the bitcell so that the bitcell drives its corresponding bit line pair comprising a bit line and a complement bit line during the read operation. After the read operation, the selected word line turns off and the corresponding bit line and complement bit line are charged to VDD during a write precharge period. Following the precharge operation, a write driver selectively discharges either the bit line or the complement bit line to the logic low state (VSS) during a write discharge period responsive to the bit to be written into the accessed bitcell. The word line for the accessed bitcell is then asserted so that the selectively-discharged bit line pair drives the accessed memory cell to write the bit into the memory cell. After the write operation, the bit line BL and complement bit line BL_n are again precharged to prepare for the next read/write cycle. The combination of the precharge period and the discharge period for a write operation may be collectively denoted as the cleanup time, which consumes precious time in the memory cycle. The cleanup time period lengthens the write access time of the PDP memory, which limits the maximum operating frequency.

To address this speed limitation, PDP memories may be split into multiple banks to reduce the capacitive load on the bit lines so that they may be charged and discharged more rapidly. However, the use of multiple memory banks increases area and power overhead, effectively negating the size advantage of the PDP memories over true dual port memories.

Accordingly, there is a need in the art for a memory architecture that retains the area and power efficiency of a PDP memory with the speed advantage of an actual dual port memory.

SUMMARY

A write driver is disclosed that selectively precharges only one of a bit line and a complement bit line in a bit line pair responsive to a bit value to be written into an accessed bitcell while discharging a remaining one of the bit line and the complement bit line. A bit is either true or false depending upon its binary state. For generality, these values may be referred to herein as a first binary value and a second binary value. The disclosed write driver advantageously uses the binary value of the bit to be written into the accessed memory cell to selectively precharge only the corresponding bit line or the complement bit line in the memory cell's bit line pair. For example, in response to the bit having a first binary state, the write driver precharges the bit line in a bit line pair while discharging a remaining complement bit line in the bit line pair. Conversely, in response to the bit having the second binary state, the write driver precharges the complement bit line in the bit line pair while discharging the remaining bit line. In this fashion, the cleanup time between a read operation and a write operation during a read/write clock cycle is advantageously reduced because the pre-charging operation does not have to be followed by a write driver operation that discharges the appropriate one of the lines in the bit line pair.

In some configurations, such as for a write multiplexed memory (which may also be designated as a column multiplexed memory), the write driver may selectively precharge the bit line or complement bit line in a bit line pair depending on the bit value while, in the same time period, precharging remaining bit lines pairs in a write multiplexing group of bit line pairs. Regardless of whether write multiplexing is used, the speed improvement provided by the disclosed write driver enables system designers to replace multibank PDP memories with a single bank PDP memory, thus reaping the full benefit of area savings afforded by PDP memories. In addition, the dynamic power consumption of the PDP memories is reduced since one of the lines in a bit line pair no longer requires a precharging and then a subsequent discharge during the write driver operation.

DETAILED DESCRIPTION

Figure 1A:
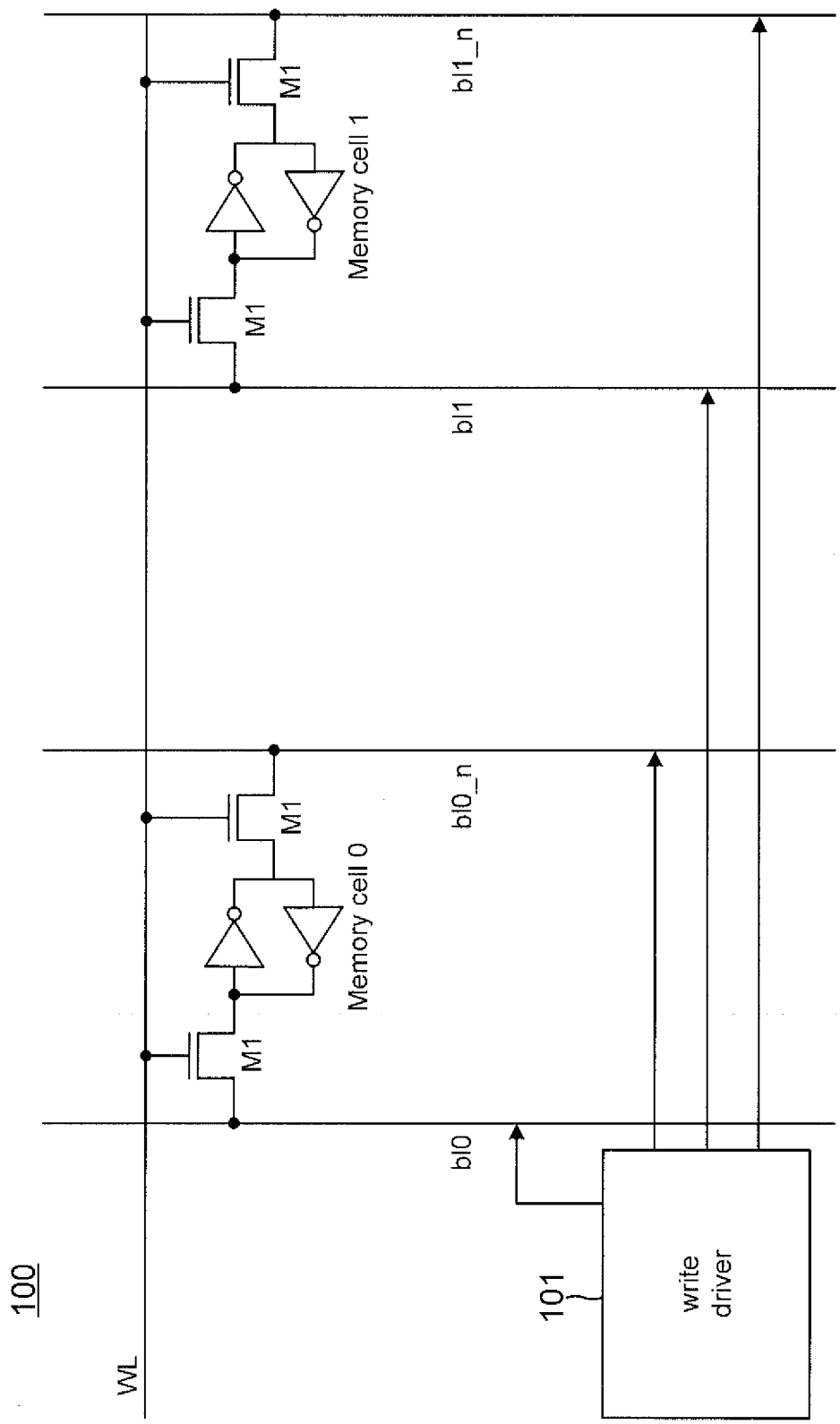
FIG. 1A is a high-level schematic diagram for a pseudo dual port (PDP) memory including a write driver in accordance with an embodiment of the disclosure.

A pseudo dual port (PDP) memory is provided that includes a write driver configured to precharge only a selected line in a bit line pair comprising a bit line and a complement bit line while discharging the remaining line in the bit line pair. In this fashion, the write driver is freed from the conventional practice of precharging both lines in the bit line pair during a precharge operation followed by a write driver operation that selectively discharges one of the lines in the bit line pair. The write driver may include a first data precharge path and a first write multiplexing precharge path for each bit line as well as a second data precharge path and a second write multiplexing precharge path for each complement bit line. Each first data precharge path and second data precharge path may include a data transistor having a gate terminal driven responsive to the bit value to be written to the corresponding memory cell. For example, the data transistors may comprise PMOS transistors that switch on when their gates are asserted low to ground (VSS). To provide the selective precharging of only one line in each bit line pair, the first data path's data PMOS transistor may be responsive to the complement of the bit to be written (designated as dt_n) into the accessed memory cell. Similarly, the second data path's data PMOS transistor may be responsive to the bit to be written (designated as dt) into the accessed memory cell.

The write driver is configured so that each data path will precharge its corresponding line in the bit line pair when its data transistor is switched on. For example, consider the case where the bit to be written (dt) is true: the complement of bit dt (dt_n) will be false (asserted low) so that the bit line for the accessed memory cell is precharged through the corresponding first data path's data PMOS transistor. But the second data path's data PMOS transistor will be switched off so that the accessed memory cell's complement bit line is not precharged. Instead, the write driver discharges the complement bit line as discussed further herein. But note that only the bit line is precharged in this case. Similarly, if the complement bit dt_n were true, only the complement bit line would be precharged since the corresponding second data path would be conducting whereas the first data path would be non-conducting. It will be appreciated, however, that the disclosed write drivers herein are not dependent upon whether a memory is active high or low. In other words, the principles and concepts disclosed herein are equally applicable to a memory in which an active low state corresponds to a true value. The following discussion will thus assume that the disclosed memories herein are active high without loss of generality.

As known in the column multiplexing arts, the memory cells and their corresponding bit line pairs disclosed herein may be organized into write multiplexing groups. Only one memory cell in each write multiplexing group is selected in any given write operation. Each memory cell in a write multiplexing group may have its own write multiplexing signal. For example, if a write multiplexing group included four memory cells, there would be four corresponding write multiplexing signals. The write multiplexing signals may be controlled so that the write multiplexing signal for an accessed memory cell is active high (charged to VDD) whereas the remaining write multiplexing signals for the non-accessed memory cells are de-asserted to VSS. Regardless of whether the write multiplexing signals are active high or active low, the first and second write multiplexing paths are configured in parallel with the corresponding first and second data paths. For example, each bit line may be precharged through either its first data path or its first write multiplexing path. Similarly, each complement bit line may be precharged through either its second data path or its second write multiplexing path.

Analogous to the data paths, each first write multiplexing path and second write multiplexing path includes a write multiplexing transistor such as a write multiplexing PMOS transistor having its gate driven responsive to the corresponding write multiplexing signal. In such an embodiment, the write multiplexing signals are active high so that the first and second write multiplexing paths for the accessed memory cell are non-conducting. But the remaining write multiplexing signals would all be false so that the first and second write multiplexing paths for the remaining memory cells in the write multiplexing group would be conductive. In this fashion, the non-active bit line pairs are precharged to VDD through their write multiplexing paths so that a subsequent read operation may begin without any precharge delay. But the write multiplexing does not affect the selective precharge of either the bit line or the complement bit line for the accessed memory cell.

These concepts and features may be better appreciated by the following discussion of example embodiments.

Example Embodiments

Turning now the drawings, FIG. 1A illustrates an example memory 100. For illustration purposes, only a single word line WL is illustrated but it will be appreciated that additional word lines may be arranged in parallel with word line WL. As known in the column multiplexing memory arts, each row of memory cells may be arranged into write multiplexed groups such that each row corresponds to multiple words that share the same word line but have different column addresses. A write multiplexed group of memory cells correspond to the same bit position in the stored words. A memory cell 0 and a memory cell 1 in memory 100 are members of the same write multiplexed group and are configured to store, for example, the zeroth bit for their respective words. A bit line pair corresponds to each memory cell in a write multiplexed group. Thus, a zeroth bit line pair comprising a bit line bl0 and a complement bit line bl0_0 corresponds to memory cell 0 whereas a first bit line pair comprising a bit line bl1 and a complement bit line bl1_n corresponds to memory cell 1.

Figure 1B:
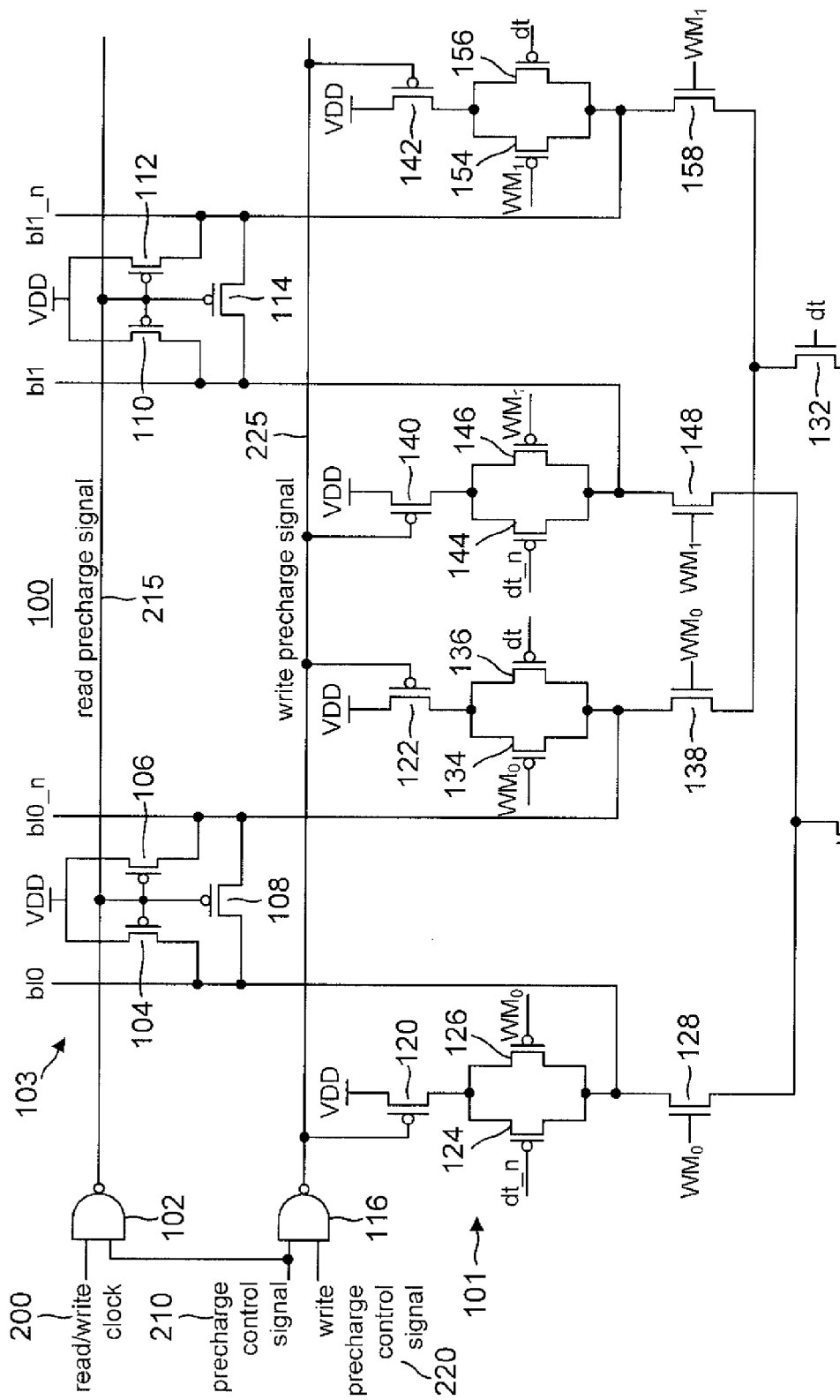
FIG. 1B is a more detailed schematic diagram for the write driver of FIG. 1A.
Figure 2:
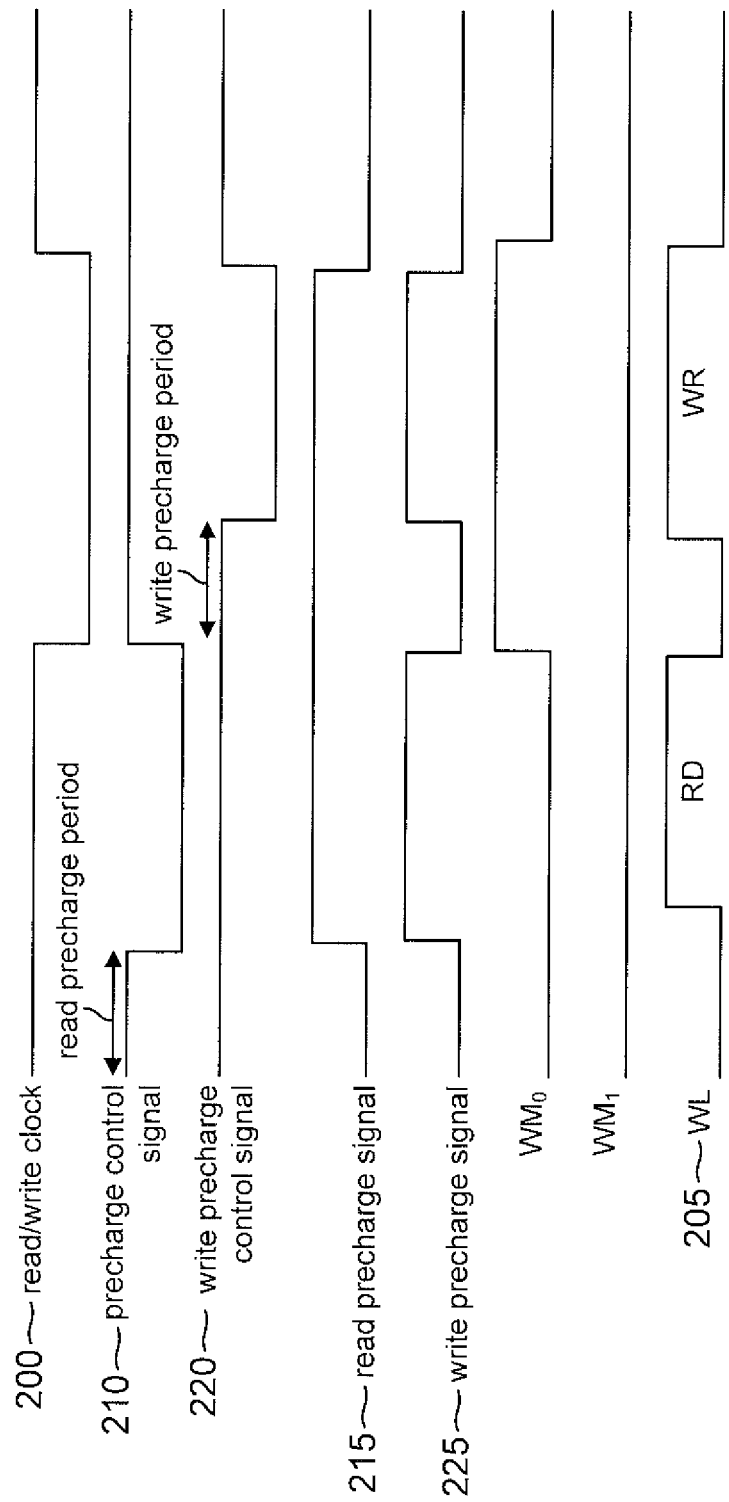
FIG. 2 is a timing diagram of read/write control and data signals for the write driver shown in FIGS. 1A and 1B during a multiplexed read/write cycle in accordance with an embodiment of the disclosure.

As known in the PDP arts, each memory cell comprises a six-transistor SRAM cell that includes a pair of NMOS access transistors M1. The remaining four transistors (not illustrated) for each memory cell comprises a cross-coupled pair of inverters as also known in the PDP arts. During a write operation, a write driver 101 selectively precharges only the bit line or the complement bit line for an accessed memory cell as discussed further herein. Write driver 101 is shown in greater detail in FIG. 1B. FIG. 2 is a timing diagram of read/write control and data signals of write driver 101 during a multiplexed read/write cycle according to one or more embodiments of the present disclosure. FIGS. 1A, 1B, and 2 will be discussed in parallel as follows to better illustrate the operation of write driver 101.

Each bit line pair may also be denoted as a column such that write multiplexing may also be denoted as column multiplexing. However, it will be appreciated that the features disclosed herein are applicable to PDP memories that do not practice column multiplexing. The following discussion focuses on the innovative write driver disclosed herein. Thus the memory cells are not shown in FIG. 1B. In that regard, it will be appreciated that an SRAM such as PDP memory 100 includes a plurality of SRAM bitcells for each bit line pair. A plurality of word lines form rows whereas the bit line pairs form columns. Each bitcell corresponds to a bit line pair/word line intersection. The number of rows depends upon a memory's depth whereas the number of columns (bit line pairs) depends upon a memory's word width.

A multiplexed read/write operation for PDP memory 100 includes a read operation to read the data from read-accessed ones of the bitcells followed by a write operation to store write data into write-accessed ones of the bitcells. The following discussion will focus on a bitcell that is both read from and written to in one multiplexed read/write clock cycle but it will be appreciated that the advantageous write driver operations disclosed herein may be carried out on bitcells that were not selected for a read operation in the same multiplexed read/write cycle. Since memory 100 is a PDP memory, a bitcell's corresponding bit line pair serves as both a read port and a write port responsive to an assertion of the corresponding word line. FIG. 2 illustrates how a word line WL voltage 205 for the word line WL of FIG. 1A is asserted for a read operation period (RD) and then again for a write operation period (WR) during one multiplexed read/write cycle as determined by a cycle of a read/write clock 200. During the first half of the clock cycle, the read operation occurs during the RD read operation period. Similarly, during the last half of the clock cycle, the write operation occurs during the write operation period WR.

The voltages on the bit line pair for an accessed bitcell in a read operation are sensed by a sense amplifier (not illustrated) to detect the stored binary value. The appropriate bit line pair may be selected by a read multiplexing signal for voltage sensing by the sense amplifier during a read operation. During a write operation for an accessed bitcell, write driver 101 selectively precharges either the bit line or the complement bit line in the corresponding bit line pair for an accessed bitcell in response to the bit value to be written into the accessed bitcell. The accessed bitcell then couples to the selectively precharged bit line pair in response to the assertion of the corresponding word line during the write operation period WR. Write driver 101 is also responsive to a set of write multiplexing signals that select for the appropriate bit line pair (column) from a write multiplexed group of bit line pairs (columns). In memory 100, a write multiplexing signal WM0 signal selects for the zeroth bit line pair whereas a write multiplexing signal WM1 selects for the first bit line pair.

Prior to the read operation period RD, a read precharge circuit 103 pre-charges both bit line pairs responsive to an active high precharge control signal 210 being asserted to VDD while a read/write clock 200 is also asserted high. Read precharge circuit 103 stops precharging when precharge control signal 210 is de-asserted (brought low) so that the precharged lines in both bit line pairs float. At this point, the read operation period RD may begin responsive to the assertion of the word line WL. The corresponding bitcell is then coupled to its corresponding precharged bit line pair. Depending upon the binary state in the bitcell, one of the lines in the corresponding precharged bit line pair will discharge more than a remaining one of the lines. For example, a first binary state stored in the accessed bitcell may be such that the corresponding bit line discharges to VSS while the corresponding complement bit line remains charged to VDD. Conversely, storage of a complement of the first binary state may be such as to discharge the complement bit line in the precharged bit line pair while the remaining bit line remains charged to VDD. With the read operation finished, the word line WL is de-asserted by being discharged to VSS between the read operation period RD and the write operation period WR. During this write precharge period, the conventional precharging of both the lines in a bit line pair for an accessed bitcell is replaced with selective precharging and discharging by write driver 101 as discussed herein.

For each bit line pair, read precharge circuit 103 includes a plurality of corresponding PMOS transistors controlled by an active low read precharge signal 215. For example, PMOS transistors 104, 106, and 108 correspond to the zeroth bit line pair. PMOS transistor 104 couples between a power supply node carrying VDD and the bit line bl0. Similarly, PMOS transistor 106 couples between the power supply node and complement bit line bl0_n. Thus, when PMOS transistors 104 and 106 are switched on in a read precharge operation responsive to read precharge signal 215 being asserted low, both lines in the zeroth bit line pair will be charged to VDD. PMOS transistor 108 couples between the bl0 and bl0_n lines such that the voltages for these lines are maintained equal while read precharge signal 215 is asserted low. Read precharge circuit 103 includes an analogous plurality of PMOS transistors 110, 112, and 114 for the first bit line pair. In this fashion, all the lines in the zeroth bit line pair and in the first bit line pair are precharged to VDD while read precharge signal 215 is asserted low.

Read precharge circuit 103 includes a NAND gate 102 that processes read/write clock 200 and precharge control signal 210 to produce read precharge signal 215. Thus, when both read/write clock 200 and precharge control signal 210 are high, read precharge circuit 103 precharges both the zeroth bit line pair and the first bit line pair to VDD in response to NAND gate 102 asserting read precharge signal 215 low. When precharge control signal 210 transitions to logic low to end the read precharge operation, read precharge signal 215 transitions to logic high. Read precharge signal 215 will remain at logic high until after the completion of the read/write operations in the corresponding cycle of read/write clock 200.

In one embodiment, read/write clock 200 cycles to a logic high value (VDD) to select for a read operation and cycles to a logic low value (VSS) to select for a write operation. As shown in FIG. 2, the write operation period WR is preceded by a write precharge period that occurs after completion of the read operation RD. Write driver 101 includes a logic gate such as a NAND gate 116 that processes precharge control signal 210 and a write precharge control signal 220 to produce an active low write precharge signal 225 that is asserted low during the write precharge period. Write precharge control signal 220 remains high during the write precharge period. Since both precharge control signal 210 and write precharge control signal 220 are high, NAND gate 116 pulls write precharge signal 225 low during the write precharge period. The write precharge period ends when write precharge control signal 220 is asserted low, which forces NAND gate 116 to assert write precharge signal 225 high. Write precharge signal 225 controls a head switch such as a PMOS transistor for each line in the bit line pairs. In the zeroth bit line, a head switch PMOS transistor 120 corresponds to bit line bl0 whereas a head switch PMOS transistor 122 corresponds to complement bit line bl0_n. Similarly, a head switch PMOS transistor 140 corresponds to bit line bl1 in the first bit line pair. Finally, a head switch PMOS transistor 142 corresponds to complement bit line bl1_n. Since each head switch PMOS transistor has its gate controlled by write precharge signal 225, all the head switch PMOS transistors are switched on during the write precharge period. The sources for each head switch PMOS transistor couples to a power supply node supplying the power supply voltage VDD.

The head switches drive the data paths and the write multiplexing paths discussed earlier. For the zeroth bit line pair, the first data path comprises a first data PMOS transistor 124 whereas its first write multiplexing path comprises a first write multiplexing PMOS transistor 126. These transistors couple in parallel between a drain for head switch PMOS transistor 120 and bit line bl0. Similarly, the second data path for the complement bit line bl0_n comprises a data PMOS transistor 136 whereas its write multiplexing path comprises a write multiplexing PMOS transistor 134. These transistors couple in parallel between a drain for head switch PMOS transistor 122 and complement bit line bl0_n. A set of PMOS transistors 144, 146, 156, and 154 form an analogous first data path, first write multiplexing path, second data path, and second write multiplexing path, respectively, for the first bit line pair.

More generally, write driver 101 includes a first data precharge path for each bit line in each bit line pair. Similarly, write driver 101 includes a second data precharge path for each complement bit line in each bit line pair. For example, data PMOS transistor 144 forms the first data precharge path to bit line bl1 in the first bit line pair whereas data PMOS transistor 156 forms the second data precharge path to complement bit line bl1_$n$. With regard to each bit line pair, the data precharge paths respond to the bit to be written to the accessed memory cell in a complementary fashion. For example, the first data precharge paths may be configured to conduct when the bit dt to be written to the corresponding bitcell is true (a complement bit dt_n thereby being false). In such an embodiment, the second data precharge paths to the complement bit lines bl0_$n$ and bl1_$n$ would be configured to conduct responsive to the corresponding complement bit dt_n being true (the corresponding bit dt thereby being false). Because of this complementary action for the first and second data precharge paths to each bit line pair, only one of the lines for an accessed memory cell is precharged during the write precharge period shown in FIG. 2.

Similarly, write driver 101 includes a first write multiplexing precharge path for each bit line and a second write multiplexing precharge path for each complement bit line. The write multiplexing precharge paths to a bit line pair are configured to turn off responsive to the write multiplexing signal for the bit line pair being asserted high. For example, write multiplexing PMOS transistors 146 and 154 form the write multiplexing precharge paths for the bit line bl1 and complement bit line bl1_$n$, respectively. When write multiplexing signal WM0 for the zeroth bit line pair is asserted high to access memory cell 0, the remaining write multiplexing signals such as a write multiplexing signal WM1 for the first bit line pair are asserted low. The low value for write multiplexing signal WM1 switches on write multiplexing PMOS transistors 146 and 154 so that bit line bl1 and complement bit line bl1_$n$ are precharged to VDD during the write precharge period.

With regard to the write multiplexing (which may also be denoted as column multiplexing), write driver 101 responds to a corresponding write multiplexing signal for each bit line pair. A write multiplexing signal WM0 is asserted high to select for the zeroth bit line pair whereas a write multiplexing signal WM1 is asserted high to select for the first bit line pair. The write multiplexing signals for the non-selected bit line pairs are kept low (VSS). The write multiplexing PMOS transistors for the accessed bit line pair turn off in response to the assertion of the corresponding write multiplexing signal. For example, assertion of write multiplexing WM0 signal turns off write multiplexing PMOS transistors 126 and 134. But the remaining write multiplexing PMOS transistors such as transistors 146 and 154 would be switched on at this time as write multiplexing signal WM1 is low when the zeroth bit line pair is selected.

Write driver 101 includes a pair of write driver NMOS transistors for each write multiplexed group of bit lines. A bit line write driver NMOS transistor 130 couples to the bit lines for each bit line pair such as bit lines bl0 and bl1 whereas a complement bit line NMOS transistor 132 couples to the complement bit lines for each bit line pair such as complement bit lines bl0_$n$ and bl1_$n$. The complement bit dt_n drives the gate of bit line write driver NMOS transistor 130. A source of bit line write driver NMOS transistor 130 couples to ground whereas its drain couples to bit line bl0 through a write multiplexing NMOS transistor 128 whose gate is controlled by write multiplexing signal WM0. Thus, when the complement bit dt_n is true and the zeroth bit pair is selected, first write driver NMOS transistor 130 discharges bit line bl0 to ground during the write precharge period. But note that the bit dt would be false in such a case so that the second data path to complement bit line bl0_$n$ would be conducting so as to charge complement bit line bl0_$n$ to VDD.

The bit dt to be written to the accessed bitcell drives the gate of complement bit line write driver NMOS transistor 132 that couples to complement bit lines bl0_$n$ and bl1_$n$ through write multiplexing NMOS transistors 138 and 158, respectively. Thus, if the bit dt is true, then the accessed bitcell's complement bit line should be discharged to VSS. In the same write precharge period, the bit line for the accessed bitcell should be charged to VDD (assuming that the bit dt is true). This selective precharge occurs because the first precharge data path to each bit line conducts responsive to the complement bit dt_n being false (which is equivalent to the bit dt being true). In this fashion, write driver 101 advantageously precharges only one line in a bit line pair responsive to the bit value to be written to the accessed bitcell while at the same time discharging the remaining line. In contrast, the conventional PDP write precharge operation precharges both lines in a bit line pair. Write driver 101 thus has faster write access times and reduces power consumption as compared to conventional PDP write precharge operation. This increase in write operation speed enables a designer to use a reduced number of memory banks or even no memory banks as compared to conventional PDP memories that required multiple memory banks so that the resulting reduced capacitive delay for the banked bit lines provided sufficient write access times despite the delay from the separate write precharge and write driver operations. In contrast, write driver 101 performs a simultaneous precharge and write driver operation during the write precharge period shown in FIG. 2.

If the complement bit dt_n and the write multiplexing signal WM0 are both true, write driver 101 discharges bit line bl0 to ground. But complement bit line bl0_$n$ has no such path to ground because complement bit line write driver NMOS transistor 132 is off in such a case since the bit dt is false. The second data path for complement bit line bl0_$n$ conducts at this time since the false value for bit dt switches data PMOS transistor 136 on so that the complement bit line bl_n0 is instead precharged to VDD at this time. Write multiplexing NMOS transistors 148 and 158 for the first bit line pair prevent this bit line pair from responding to the bit dt though complement bit line write driver NMOS transistor 132 or from responding to the complement bit dt_n through bit line write driver NMOS transistor 130 when the zeroth bit line pair is selected since write multiplexing signal WM1 is false in such a case. Similarly, write multiplexing NMOS transistors 128 and 138 prevents the zeroth bit line pair from responding to the bit dt or the complement bit dt_n when the first bit line pair is selected since write multiplexing signal WM0 is false at that time.

In one embodiment, the write driver comprises a means for selectively precharging only one of the bit line and the complement bit line to a power supply voltage VDD responsive to a bit value to be written into a bitcell and for discharging a remaining one of the bit line and the complement bit line during the selective precharge. In another embodiment, the bit line and the complement bit line form a bit line pair in a write multiplexed group of additional bit line pairs such that the write driver also comprises a means for precharging the additional bit line pairs to VDD during the selective precharging of the first bit line pair. In another embodiment, the write driver also comprises means for receiving a write multiplexing signal and for selectively precharging the first bit line pair responsive to the write multiplexing signal.

Bit lines bl0, bl0_$n$, bl1, and bl1_$n$ are all precharged to VDD during the read precharge period as discussed above. Upon the conclusion of the read precharge period, precharge control signal 210 is asserted low, causing the read precharge signal 215 to assert high to terminate the read precharging operation. When read/write clock 200 cycles low, precharge control signal 210 is again asserted high while write precharge control signal 220 is also high to cause NAND gate 116 to assert write precharge signal 225 low to turn on all the head switch PMOS transistors 120, 122, 140, and 142 during the write precharge period. The non-selected bit line pairs are thus charged to VDD during the write precharge period since their corresponding head switches and write multiplexing precharge paths are conducting. Conversely, the write multiplexing precharge paths for the selected bit line pair are non-conducting during the write precharge period. In FIG. 2, it is assumed that the zeroth bit line pair is selected through the assertion of the write multiplexing signal WM0 during the write precharge period and during the subsequent write operation WR. Write multiplexing signal WM1 is thus low during this time.

One of the first and second data precharge paths for the zeroth bit line pair selectively turns on responsive to the complement bit dt_n and the bit dt, respectively. If the bit dt is logic high, the first data precharge path for the bit line bl0 turns on through data PMOS transistor 124 while the second data precharge path for the complement bit line bl_n0 turns off through data PMOS transistor 136. At the same time, the logic high value for the bit dt turns on complement bit line write driver NMOS transistor 132 to pull the complement bit line bl_n0 low. For the first bit line pair, the WM1 signal is at logic low. The first and second write multiplexing precharge paths are thus on for the first bit line pair through write multiplexing PMOS transistors 146 and 154, respectively, to precharge bit line bl1 and complement bit line bl1_n to VDD. Therefore, only bit line bl0 is selectively precharged (and complement bit line bl0_n is selectively discharged) in the zeroth bit line pair responsive to the bit dt being true during the write precharge period when the WM0 signal is asserted. Conversely, when the WM1 signal is asserted high and the WM0 signal is deasserted, bit line bl0 and complement bit line bl0_n are both precharged to VDD. At the same time, bit line bl1 or complement bit line bl_n1 would be selectively precharged responsive to the bit dt (or equivalently, to the complement bit dt_n). The selective precharging and discharging of the bit lines eliminates the dedicated precharging time of the conventional PDP memory when all bit lines are precharged to VDD during a write precharge period that is distinct from the write driver operation. Therefore, the read/write cycle time is reduced, enabling the PDP memory to operate at a higher memory clock speed and making it possible to replace multibank PDP memories with a single bank of high-speed PDP memory.

Referring again to FIG. 2, the write precharge period ends when write precharge control signal 220 transitions to the logic low state, causing write precharge signal 225 to become logic high to terminate the selective pre-charging. The WL for the accessed bitcell is then asserted for the write operation period WR to drive the selectively precharged state of the corresponding bit line pair into the selected memory location. The termination of the write operation period WR is indicated by the low-to-high transition of the read/write clock 200 starting another memory access cycle.

Figure 3:
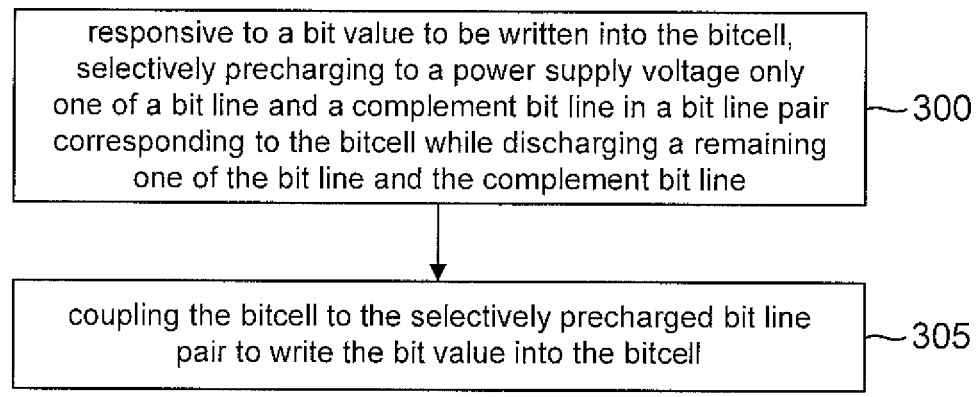
FIG. 3 is a flowchart of an example method of use for the write driver of FIGS. 1A and 1B in accordance with an embodiment of the disclosure.

An example method of use for memory 100 will now be discussed.
Example Method of Use A flowchart for an example method of use of a pseudo dual port memory such as PDP memory 100 having a write driver such as write driver 101 of FIG. 1 is shown in FIG. 3. The method includes a step 300 of, responsive to a bit value to be written into a bitcell, selectively precharging to a power supply voltage only one of a bit line and a complement bit line in a bit line pair corresponding to the bitcell while discharging a remaining one of the bit line and the complement bit line. The selective precharging may be performed, for example, using the circuitry and signals described above in connection with FIGS. 1B and 2. The selective precharging may be further responsive to a write multiplexing signal.

For example, selectively precharging only one of the bit line and the complement bit line in the first bit line pair to the power supply voltage while discharging the remaining one of the bit line and the complement bit line may include asserting a write precharge signal to turn on a head switch to power a data precharge path for the selectively precharged line. In addition, discharging the remaining one of the bit line and the complement bit line includes switching on a write driver transistor to couple the remaining one of the bit line and the complement bit line to ground.

The method also includes a step 305 of coupling the bitcell to the selective precharged bit line pair to write the bit value into the bitcell. For example, step 305 may comprise asserting the corresponding word line voltage for the bitcell to turn on the access transistors M1 shown in FIG. 1A.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A method for accessing a bitcell of a pseudo dual port (PDP) memory, comprising:
    asserting a word line voltage during a read portion of a memory clock cycle to couple a bitcell to a bit line and a complement bit line for a bit line pair;
    de-asserting the word line voltage for a write precharge portion of the memory clock cycle; and
    during the write precharge portion of the memory clock cycle, selectively precharging to a power supply voltage VDD only one of the bit line and the complement bit line in the bit line pair while discharging a remaining one of the bit line and the complement bit line, the selective precharging and discharging being responsive to a bit value to be written into the bitcell;
    coupling the selectively precharged and discharged bit line pair to the bitcell to write the bit value into the bitcell during a read/write clock cycle.

2. The method of claim 1, wherein the bit line pair is part of a write multiplexed group comprising the bit line pair and additional bit line pairs, the method further comprising precharging the additional bit line pairs to the power supply voltage VDD during the selective precharging of the bit line pair.

3. The method of claim 2, wherein the selective precharging of the bit line pair is further responsive to assertion of a write multiplex signal corresponding to the bit line pair.

4. The method of claim 2, wherein the precharging of the additional bit line pairs is responsive to a de-assertion of a write multiplex signal for each of the additional bit line pairs.

5. The method of claim 3, wherein the selective precharging of the bit line pair comprises switching on a first data precharge path to the one of the bit line and the complement bit line responsive to the bit value, and wherein the discharging comprises switching off a second data precharge path to the remaining one of bit line and the complement bit line responsive to the bit value.

6. The method of claim 5, further comprising switching on a first head switch for the first data precharge path and switching on a second head switch for the second data precharge path.

7. The method of claim 1, further comprising:
reading a stored value from the bitcell during the read portion of the memory cycle.

8. The method of claim 7, wherein reading the stored value from the bitcell during the read portion of the memory cycle occurs after a read precharge operation of precharging both the bit line and the complement bit line in the bit line pair.

9. A pseudo dual port (PDP) memory, comprising:
a bit line and a complement bit line in a first bit line pair;
a read pre-charge circuit configured to precharge the bit line and the complement bit line during a read precharge portion of a memory clock cycle; and
a write driver configured to selective precharge only one of the bit line and the complement bit line to a power supply voltage VDD responsive to a bit value to be written into a bitcell during a write portion of the memory clock cycle, the write driver being further configured to discharge a remaining one of the bit line and the complement bit line during the selective precharge.

10. The PDP memory of claim 9, further comprising a write multiplexed group of bit line pairs including the first bit line pair and additional bit line pairs, and wherein the write driver is further configured to precharge the additional bit line pairs such that a bit line and a complement bit line in each of the additional bit line pairs is precharged to VDD during the selective precharging of the first bit line pair.

11. The PDP memory of claim 10, wherein the write driver is further configured to receive a write multiplexing signal and to selectively precharge the first bit line pair responsive to the write multiplexing signal.

12. The PDP memory of claim 11, further comprising:
a first data precharge path and a first write multiplexing precharge path coupled in parallel to the bit line; and
a second data precharge path and a second write multiplexing precharge path coupled in parallel to the complement bit line.

13. The PDP memory of claim 12, wherein the first data precharge path comprises a data transistor having a gate configured to receive a complement of the bit value, and wherein the second data precharge path comprises a data transistor having a gate configured to receive the bit value.

14. The PDP memory of claim 13, wherein the first write multiplexing precharge path and the second write multiplexing precharge path each comprises a write multiplexing transistor having a gate configured to receive the write multiplexing signal.

15. The PDP memory of claim 12, wherein the first data precharge path and the first write multiplexing path couple in parallel to a power supply node through a first head switch, and wherein the second data precharge path and the second write multiplexing path couple in parallel to a power supply node through a second head switch.

16. The PDP memory of claim 9, further comprising a logic gate configured to assert a write precharge signal during the selective precharging of the first bit line pair, and wherein the first head switch and the second head switch are configured to switch on responsive to the assertion of the write precharge signal.

17. The PDP memory of claim 16, wherein the logic gate comprises a NAND gate.

18. A pseudo dual port (PDP) memory, comprising:
a bit line and a complement bit line in a first bit line pair;
a read pre-charge circuit configured to precharge the bit line and the complement bit line during a read precharge portion of a memory clock cycle; and
means for selectively precharging, during a write precharge portion of the memory clock cycle, only one of the bit line and the complement bit line to a power supply voltage VDD responsive to a bit value to be written into a bitcell and for discharging a remaining one of the bit line and the complement bit line during the selective precharge.

19. The PDP memory of claim 18, further comprising:
a write multiplexing group including the first bit line pair and additional bit line pairs; and
means for precharging the additional bit line pairs such that a bit line and a complement bit line in each of the additional bit line pairs is precharged to the power supply voltage VDD during the selective precharging of the first bit line pair.

* * * * *